(12) United States Patent
Knickerbocker et al.

(10) Patent No.: US 7,944,305 B2
(45) Date of Patent: May 17, 2011

(54) RF PRE-AMPLIFIERS AND POWER AMPLIFIERS

(75) Inventors: Howard L. Knickerbocker, Middlefield, MA (US); Patrick T. Tracy, Bolton, CT (US)

(73) Assignee: Coherent, Inc., Santa Clara, CA (US)

( * ) Notice: Subject to any disclaimer, the term of this patent is extended or adjusted under 35 U.S.C. 154(b) by 49 days.

(21) Appl. No.: 12/478,393

(22) Filed: Jun. 4, 2009

(65) Prior Publication Data

US 2010/0019849 A1    Jan. 28, 2010

Related U.S. Application Data

(60) Provisional application No. 61/084,006, filed on Jul. 28, 2008.

(51) Int. Cl.
*H03F 3/16* (2006.01)
(52) U.S. Cl. ........................................ 330/277; 330/305
(58) Field of Classification Search .................. 330/277, 330/302, 305–306
See application file for complete search history.

(56) References Cited

U.S. PATENT DOCUMENTS

| | | | |
|---|---|---|---|
| 4,443,877 A | 4/1984 | Chenausky et al. | |
| 5,150,372 A | 9/1992 | Nourrcier | |
| 6,181,719 B1 | 1/2001 | Sukhman et al. | |
| 7,161,434 B2 * | 1/2007 | Rhodes | 330/302 |
| 7,265,619 B2 * | 9/2007 | Tayrani | 330/251 |
| 2008/0204134 A1 | 8/2008 | Knickerbocker et al. | |

OTHER PUBLICATIONS

U.S. Appl. No. 12/416,908, filed Apr. 1, 2009, by W. Shef Robotham, Jr. et al., entitled "Frequency-Agile RF-Power Excitation for Driving Diffusion-Cooled Sealed-Off, RF-Excited Gas Lasers".

* cited by examiner

*Primary Examiner* — Hieu P Nguyen
(74) *Attorney, Agent, or Firm* — Morrison & Foerster LLP

(57) ABSTRACT

An RF amplifier circuit includes a MOSFET connected to an RF output of the circuit via an impedance matching network including an inductor and a tuning capacitor connected in parallel with the inductor and the MOSFET. DC voltage is applied to the MOSFET via a series path through a radio frequency choke and the inductor of the impedance matching network.

11 Claims, 2 Drawing Sheets

RF PRE-AMPLIFIERS AND POWER AMPLIFIERS

PRIORITY CLAIM

This application claims priority of U.S. Provisional Application No. 61/084,006, filed Jul. 28, 2008, the complete disclosure of which is hereby incorporated by reference.

TECHNICAL FIELD OF THE INVENTION

The present invention relates in general to radio frequency (RF) power supplies for driving diffusion-cooled, sealed-off, $CO_2$ gas-discharge. The invention relates in particular to solid-state RF amplifier stages used in such power supplies.

DISCUSSION OF BACKGROUND ART

Solid-state RF power supplies (power supplies based on RF transistors) are preferred over RF vacuum tube power supplies for driving discharges in diffusion-cooled, sealed-off, $CO_2$ gas-discharge lasers used in material processing applications. One reason for this preference is that solid-state power supplies are typically smaller than corresponding vacuum tube supplies and do not need to be driven by potentially lethal voltages. A single mode diffusion cooled $CO_2$ laser typically has an efficiency of about 10%. This means that a RF solid-state power supply having a 10 kilowatt (kW) output is required to provide 1.0 kW output from the laser.

A high-power RF power supply typically includes an oscillator or frequency source connected to a series of pre-amplifier stages followed by a final power amplifier stage. Each stage includes at least one power transistor. One of the most common types of RF power transistors used in an amplifier stage is a metal oxide semiconductor field-effect transistor (MOSFET). One commercially available power MOSFET is a model NXP model BLF175, form Koninklijke Philips Electronics N.V. (Philips) of Eindhoven, Holland. This MOSFET has a power gain of between about 13 and 14 dB with an output power of approximately 40 watts (W) when operated in a class C mode at a 100 megahertz (MHz) operating frequency.

The number of transistors per amplifier stage increases as the power is increasingly amplified. By way of example, a final amplifier stage of an RF power supply having 10 kW RF output, would require about 25 of the above-mentioned Philips NXP/BLF 175 MOSFETS (transistors) connected in parallel.

Manufacturers of MOSFETs do provide power combined RF MOSFETs arranged in a push-pull arrangement in a single package to a yield higher power output than that of a single MOSFET. One such MOSFET is a Philips Model BLF 278A capable of 300 W output. A number of such MOSFET packages can be connected in parallel to yield even higher output powers.

Simply stated: as the output power of the RF power supply increases, the total number of transistors increases dramatically. Consequently, limiting the number of circuit elements, such as resistors, inductors and capacitors, per stage of amplification becomes increasingly important with increasing power output from the standpoint of size and cost of the RF power supply.

Each amplifier stage in series thereof has an output impedance matching network for matching the impedances of that stage to a following stage in this series in order to maximize power transmission to the following stage. One example of a prior-art amplification stage is schematically illustrated by the circuit diagram 10 of FIG. 1.

Here, the impedance matching network includes an inductor L1, connected in series with the drain (D) side of a MOSFET $Q_1$ (in n-channel configuration) plus a parallel tuning capacitor C1. The RF input to the amplified is connected to the gate G of MOSFET Q1, with source S of the MOSFET being connected to ground. The matching network takes the output impedance of the MOSFET and translates it to the, usually lower, input impedance of the transistor to which it delivers RF power. The impedance of that transistor is represented in FIG. 1 by a 50 Ohm (50Ω) resistor R1. C1 is usually adjusted consistent with the inductance of L1 to obtain 50Ω impedance. The load impedance value of 50 is a common value in practice, however, the load impedance value can have some other value, with C1 selected accordingly.

An RF coupling capacitor C2 serves to prevent DC power from being fed to the input of the following stage of amplification. The value of C2 is selected to provide a small reactance, and accordingly low loss, at the operating frequency of the amplifier. Only one MOSFET transistor is depicted in FIG. 1 for simplicity of illustration. Those skilled in the RF art will recognize that MOSFET Q1 could be substituted by a higher wattage, power-combined transistor package such as the above-mentioned Philips BLF 278A, to obtain a higher output power.

An L1-C1 impedance matching network as depicted in FIG. 1 usually has transmission roll-off at frequencies beyond the operating frequency of the amplifier between about minus 6 dB and minus 10 dB per frequency octave. This serves to suppress resonances above the operating frequency of the preamplifier for stabilizing power output. Such a minus 6 dB roll-off is often inadequate for such harmonic suppression. Consequently, additional circuitry (not shown in FIG. 1) is normally added to the preamplifier for harmonic attenuation, at a cost of additional electronic components.

Each pre-amplifier in a series thereof is provided with an individual DC power input. In circuitry 10, this is represented by a DC input port VCC+ to the amplifier. It is important to isolate the RF power output of the MOSFET from the DC power supply. This is usually accomplished with a large inductor, commonly called a RF "choke" (RFC), connected in series between the DC power supply and the MOSFET. This inductor is designated L2 in FIG. 1. For additional isolation between the RF and DC, a large RF by-pass (RFBP) capacitor, C3 is also provided. Capacitor C3 is selected to have very low impedance over the RF frequency range of the amplifier. In practice several capacitors in parallel are usually required provide a low RF impedance path to ground. The combination of RFC L2 and by-pass capacitor C3 result in almost no RF energy entering the DC power supply circuitry.

DC power from the DC supply passes through inductor (RFC) L2 with only a very small loss, caused by the wire windings of the RFC. The RFC, however, presents a high impedance to the RF so only a very small amount of RF power is remaining after the RFC to enter the output port of the DC supply. To achieve a sufficiently high RF loss, the inductive reactance of the choke is usually chosen to be between about 10-times and 20-times the drain-impedance of the MOSFET. This requires that the RFC L2 be very large. Large RFCs are known to exhibit poor high frequency characteristics which can contribute to amplifier instability. At high pulse repetition frequencies (PRF), pulse ringing, with high voltage peaks, is commonly encountered in the circuit of FIG. 1. The high voltage peaks of the pulse ringing arise because of the high value of the inductance in the RFC. Such high voltage ringing is undesirable because it deteriorates the reliability of the MOSFET. Because of this, additional circuitry (not shown) is usually added to suppress such ringing.

FIG. 2 is a graph schematically illustrating computed transmission in decibels (dB) as a function of frequency in megahertz (MHz) for one example of a prior art, 40 W output preamplifier stage, constructed according to the circuit arrangement of FIG. 1, and having an operating frequency chosen as 81 MHz, indicated by circle 1. Transmission at the second harmonic (162 MHz) is indicated by circle 2. Transmission at the third harmonic (243 MHz) is indicated by circle 3. It can be seen that second and third harmonics are attenuated by approximately −9 db and −16.25 dB respectively. The attenuation at 1 MHz is only approximately −18 dB which in most cases is considered insufficient.

In summary, prior-art RF amplifier circuitry as represented schematically by circuitry 10 of FIG. 1 has a relatively shallow roll-off at harmonic frequencies which leads to parasitic oscillation in the output. The circuitry also requires a large, heavy, and expensive RF choke in combination with a bank of low impedance capacitors to isolate a DC power supply for the amplifier from RF output of the amplifier MOSFET. In addition to size, weight, and expense, the large inductance RF choke contributes to pulse ringing and instability, a problem which increases with rapid rise and fall time of RF pulses as the pulse repetition frequency (PRF) increases. There are presently $CO_2$ laser material-processing applications that require PRFs as high as 200 kHz. To reduce or eliminate parasitic oscillation and pulse ringing in the circuit of FIG. 1 additional circuitry is usually added. This additional circuitry further increases the size, complexity, and cost of a solid-state RF power supply that uses the prior-art circuitry. There is a need for circuitry that can mitigate if not eliminate shortcomings of prior-art circuitry, in order to facilitate development of $CO_2$ lasers having average power output of several kilowatts.

SUMMARY OF THE INVENTION

In one aspect an RF amplifier circuit in accordance with the present invention comprises a transistor arranged to receive an RF input to be amplified. The circuit has an impedance matching network including a first inductor connected in series between the transistor and an RF output of the circuit, and a tuning capacitor connected in parallel with the transistor and the first inductor. A source of DC voltage is applied to the circuit between the first inductor and the RF output. A second inductor is connected between the DC voltage source and the amplifier circuit between the first inductor and the tuning capacitor and functions as an RF choke.

Applying the DC voltage to the circuit between the first inductor and the tuning capacitor provides that the capacitance value of the tuning capacitor can be selected cooperative with the inductance value of the first inductor to maximize transmission of amplified RF from the transistor to the amplifier output at the RF input frequency, and also to resonate with the second inductor at that frequency. This allows the second inductor to be effective as an RF choke at an inductance value less than one-half of that which would be required in a prior-art amplifier of the same output power but wherein the DC voltage is applied via the second inductor directly to the transistor as described above with reference to FIG. 1. Other advantages of the inventive circuit are described in the detailed description of the present invention set forth below.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
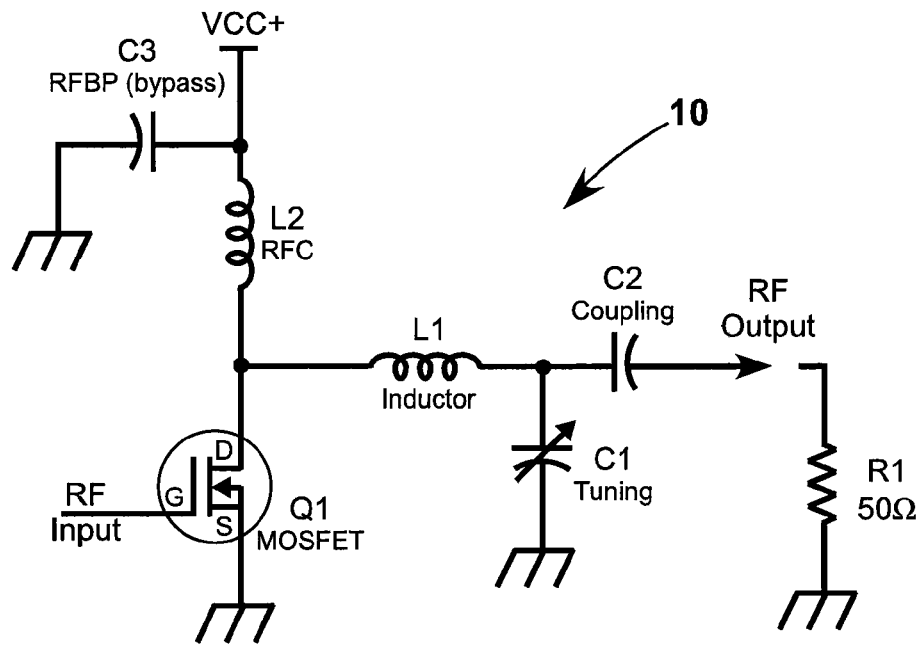
FIG. 1 schematically illustrates a prior-art RF amplifier circuit including a MOSFET connected to an RF output of the circuit via an impedance matching network including an inductor and a tuning capacitor connect in parallel with the inductor and the MOSFET, with DC voltage applied via an RFC directly to the MOSFET.
Figure 3:
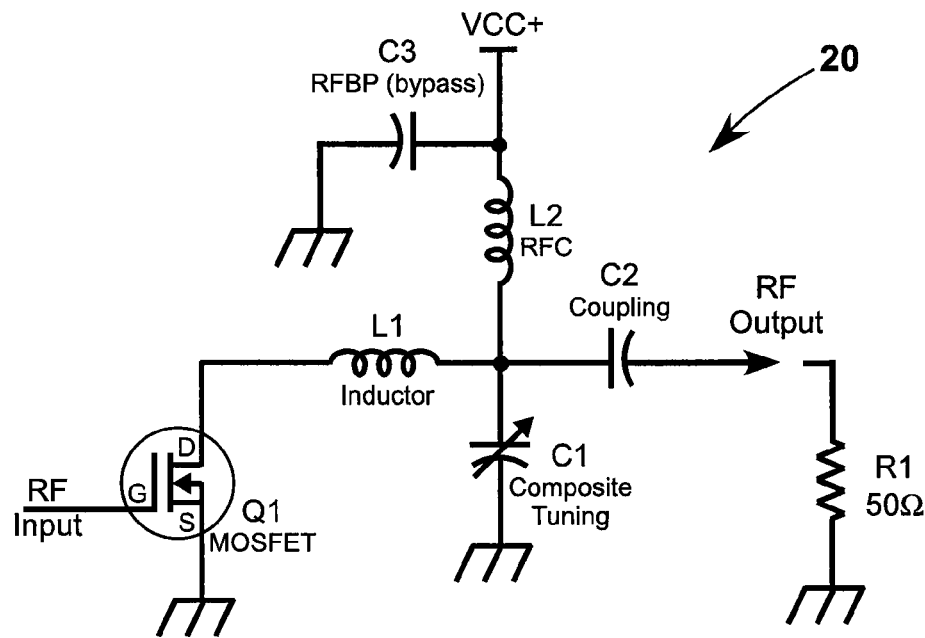
FIG. 3 schematically illustrates an RF amplifier circuit in accordance with the present invention similar to the circuit of FIG. 1 but wherein the DC voltage is applied to the MOSFET via the RFC and the inductor of the impedance matching network.

Referring again to the drawings, wherein like features are designated by like reference characters, FIG. 3 is a circuit diagram schematically illustrating a preferred embodiment 20 of RF amplifier circuitry in accordance with the present invention. Circuitry 20 is similar to circuitry 10 of FIG. 1 with a major difference being that DC power is connected at the high impedance (50Ω) output side of the impedance matching network formed by inductor L1 and capacitor C1 instead of being connected directly to the low impedance (typically about 12Ω) output (drain D) of MOSFET Q1.

Inserting the DC power at the 50 Ohm output side of the L1-C1 matching network has several benefits. One benefit is that the DC power supply is now rendered relatively insensitive to the RF output of the MOSFET by decoupling RFC L2 and by-pass capacitor C3 from the drain of the MOSFET. Another advantage is that capacitor C1 can function as a composite capacitor which can serve both to tune the impedance matching network to the required value, here, nominally 50Ω, and to resonate the RFC inductor L2 to the operating frequency of the amplifier. By resonating the RFC to the amplifier frequency, the inductance of the RFC can be less than that required in the prior-art circuitry, which means that the choke can be correspondingly smaller, lighter and less expensive, in addition to providing performance advantages such as reduced pulse ringing and spurious oscillation.

Normal convention is to select an inductance reactance for the RFC to be, say 20 times 50Ω, i.e., 1000Ω. At a frequency of 81 MHz (see FIG. 2), for example, the inductance required to obtain an impedance of 1000 Ohms is approximately 2 micro-Henrys (µHy). There is a high probability that this value of inductance would be self resonant at a frequency other than the desired operating frequency, wherever the MOSFET has gain. Each undesired resonance can lead to spurious oscillation or amplifier instability. At 81 MHz an inductor of 100 nano Henrys (nHy) has a reactance of 50Ω which is equal to the design impedance of the preamplifier. The desired impedance of the matching network is obtained by adjusting the value of the composite capacitor C1 once the inductance of inductor L1 is selected. The capacitor C1 is tuned to be in resonance with the choke at the RF frequency which helps to minimize any unwanted resonances.

By way of example at 81 MHz, a 69.7 picofarad (pF) capacitor is required to resonate with a value of 42.0 nHy selected for inductor L1 of the impedance matching network. Optionally, an additional capacitance can be added in parallel to C1 so that the composite C1 capacitor can also resonate with the RFC at the amplifier operating frequency while still providing variable matching for the L1-C1 impedance matching circuit. By way of example, for a value of L2 equal to 100 nHy, the amount of added capacitance is 38.8 pF for a total capacitance of 108.5 pF for C1.

Figure 4:
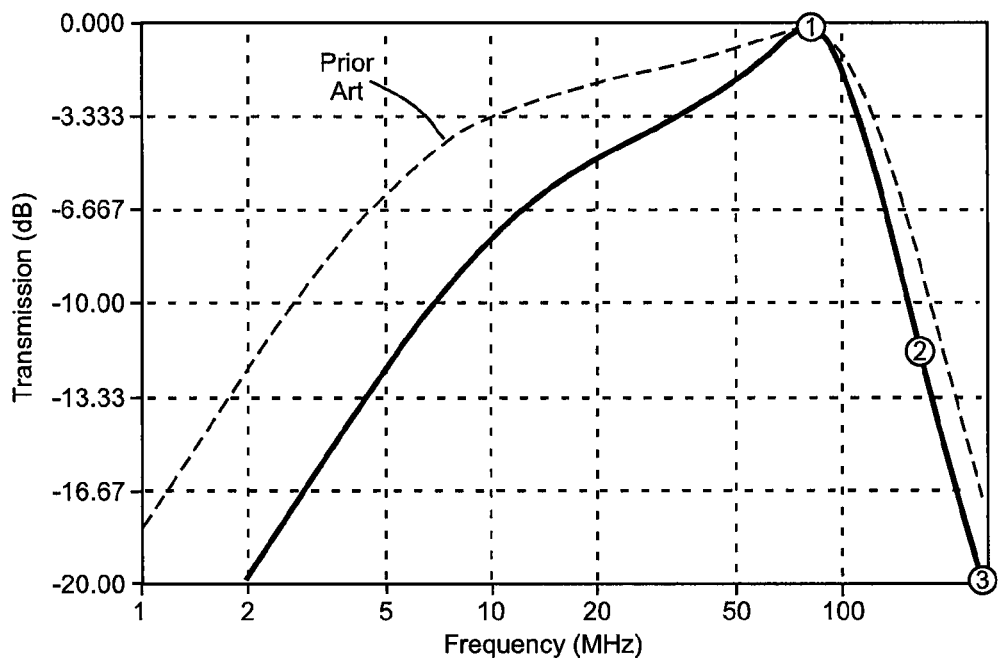
FIG. 4 is a graph schematically illustrating computed transmission as a function of frequency of RF power from the MOSFET to the RF output of one example of the amplifier circuit of FIG. 3, wherein the capacitance value of the tuning capacitor is selected cooperative with the inductance of the inductor to maximize transmission of the impedance matching network and to resonate with the RFC.

FIG. 4 is a graph schematically illustrating transmission in dB as a function of frequency in MHz for one example (bold curve) of a, 40 W-output preamplifier stage constructed according to the inventive circuit arrangement of FIG. 3 and having an operating frequency chosen as 81 MHz represented by circle 1. A dashed curve shows, for comparison, the performance of the prior art example of FIG. 2.

The transmissions at the second harmonic (162 MHz-circle 2) and third harmonic (243 MHz-circle 3) are attenuated by approximately −11.5 and −19.7 dB respectively. These vales are an appreciable improvement over the −9 dB and −16.75 dB values obtained for the prior-art example. At 1 MHz the transmission for the inventive circuitry was found to be −25.8 dB compared with −18 dB for the prior-art circuitry. The bandwidth of the inventive circuitry is somewhat less than that of the prior-art circuitry but is still more than adequate for most applications, such as dual frequency discharge ignition and maintenance, where some limited tunability of the output frequency is desirable.

Figure 2:
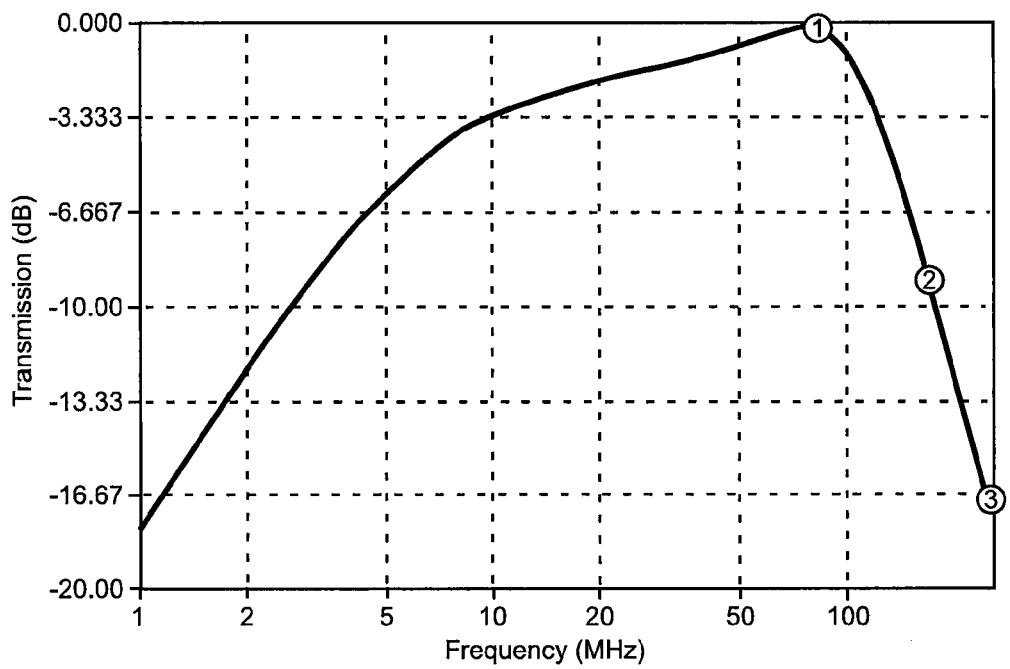
FIG. 2 is a graph schematically illustrating computed transmission of the impedance matching network as a function of frequency for one example of the amplifier circuit of FIG. 1.

In TABLE 1 are listed assumed values for components and parameters used to generate the graphs of FIGS. 2 and 4. Of particular note is the 2.5 times reduction in inductance of the RFC for the inventive circuitry.

TABLE 1

| Component/Parameter | Prior-Art Value | Inventive Value |
|---|---|---|
| L2 (RFC) | 250 nHy | 100 nHy |
| L1 | 42.1 nHy | 42.1 nHy |
| C1 | 74.9965 pF | 108.5 pF |
| MOSFET Output Impedance | 12 Ohms | 12 Ohms |
| R1 (Load Impedance) | 50 Ohms | 50 Ohms |
| Operating Frequency | 81 MHz | 81 MHz |

The value of the tuning capacitor (C1) is approximately 45% larger when compared with the value for the prior-art invention circuitry. The advantages incurred by C1 resonating both with L1 and the RFC at the operating frequency of the amplifier, however, are an excellent trade-off with the increased value of C1 in the inventive circuitry.

A comparison of the transmission versus frequency improvements between the prior-art circuitry and the inventive circuitry of TABLE 1 is provided in TABLE 2.

TABLE 2

| | Transmission | | Improvement | |
|---|---|---|---|---|
| Frequency | Prior Art | Inventive | Δ | % |
| 162 MHz | −9 dB | −11.5 dB | −2.5 dB | 27.8 |
| 243 MHz | −16.5 dB | −19.7 dB | −2.95 dB | 17.6 |
| 1 MHz | −18 dB | −25.8 dB | −7 dB | 43.3 |

It can be seen that the inventive circuitry provides a 27.8% improvement in transmission reduction at the second harmonic of 81 MHz, namely 162 MHz; a 17.6% improvement at the third harmonic (243 MHz); and a 43.3% improvement at 1 MHz. These performance improvements are obtained while also providing lower costs and smaller size for the RFC and more stable amplifier characteristics attendant on that smaller size.

Those skilled in the art to which the present invention pertains will recognize that while the circuitry in accordance with the present invention is discussed in the context of a pre-amplifier stage of an RF power supply, the circuitry can also be used as a stand alone RF power stage to drive a laser having sufficiently low output power. Those skilled in the art will also recognize that any single electronic component of the above-described inventive circuitry may be replaced with a combination of two or more like components to provide a particular value or function.

In summary present invention is described above in terms of a preferred embodiment. The invention is not limited, however, to the embodiment described and depicted. Rather, the invention is limited only by the claims appended hereto.

What is claimed is:

1. An RF amplifier circuit comprising:
a transistor arranged to receive an RF input to be amplified, the RF input having an operating frequency;
an impedance matching network including a first inductor connected in series between the transistor and an RF output of the circuit and a tuning capacitor connected in parallel with the transistor and the first inductor;
a source of DC voltage supplied to the circuit between the first inductor and the RF output; and
a second inductor connected between the DC voltage source and the amplifier circuit between the first inductor and the tuning capacitor and functioning as an RF choke, wherein the capacitive value of the tuning capacitor is selected to be in resonance with the second inductor at the operating frequency of the RF input.

2. The RF amplifier circuit of claim 1, further including a bypass capacitor connected on one side thereof between the DC voltage source and the second inductor.

3. The RF amplifier circuit of claim 2, wherein the bypass capacitor is connected on the opposite side thereof to ground.

4. The RF amplifier circuit of claim 1, further including a coupling capacitor connected between the first inductor and the RF output.

5. The RF amplifier circuit of claim 1, wherein the RF input is at a predetermined frequency, the transistor has a predetermined output impedance and the amplifier output has a predetermined load impedance different from the transistor impedance, and wherein the capacitive value of the tuning capacitor is selected cooperative with the inductance value of the first inductor to match output impedance of the transistor to the amplifier load impedance and to resonate with the second inductor at about the predetermined frequency.

6. The RF Amplifier circuit of claim 5, wherein the frequency is 81 MHz, the transistor output impedance is 12 Ohms, the load impedance is 50 Ohms, the inductance of the first inductor is 42.1 nHy, the inductance of the second inductor is 100 nHy, and the capacitance of the tuning capacitor is 108.5 pF.

7. An RF amplifier circuit comprising:
a transistor arranged to receive an RF input to be amplified, the RF input having an operating frequency;
an impedance matching network including a first inductor connected in series between the transistor and an RF output of the circuit and a tuning capacitor connected in parallel with the transistor and the first inductor;

a coupling capacitor connected in series with the first inductor between the first inductor and the RF output;

a second inductor, wherein the capacitive value of the tuning capacitor is selected to be in resonance with the second inductor at the operating frequency of the RF input;

a source of DC voltage supplied to the circuit via the second inductor between the first inductor and the coupling capacitor, the second inductor functioning as an RF choke; and a bypass capacitor connected on one side thereof between the second inductor and the DC voltage source and on an opposite side thereof to ground.

8. The RF amplifier circuit of claim 7, wherein the RF input is at a predetermined frequency, the transistor has a predetermined output impedance and the amplifier output has a predetermined load impedance different from the transistor impedance, and wherein the capacitive value of the tuning capacitor is selected cooperative with the inductance value of the first inductor to match the output impedance of the transistor to the amplifier load impedance and to resonate with the second inductor at about the predetermined frequency.

9. The RF Amplifier circuit of claim 8, wherein the frequency is 81 MHz, the transistor output impedance is 12 Ohms, the load impedance is 50 Ohms, the inductance of the first inductor is 42.1 nHy, the inductance of the second inductor is 100 nHy, and the capacitance of the tuning capacitor is 108.5 pF.

10. An amplifier circuit for amplifying an RF input having an input frequency, comprising:

a MOSFET having a gate, and arranged to receive at the gate the RF input to be amplified, the MOSFET having an output impedance;

an impedance matching network for matching the output impedance of the MOSFET to a load impedance of the amplifier, the impedance matching network including a first inductor connected in series between the drain of the MOSFET and an RF output of the circuit and a tuning capacitor connected in parallel with the MOSFET and the first inductor;

a coupling capacitor connected in series with the first inductor between the first inductor and the RF output;

a second inductor;

a source of DC voltage supplied to the MOSFET via the second inductor and the first inductor, the second inductor functioning as an RF choke; and wherein the capacitive value of the tuning capacitor is selected cooperative with the inductance value of the first inductor to maximize, at the input frequency, the transmission of RF output of the MOSFET to the RF output of the amplifier, and to resonate with the second inductor at about the input frequency.

11. The RF amplifier circuit of claim 10, wherein the MOSFET is an n-channel MOSFET and the DC voltage is supplied to the drain of the MOSFET.

* * * * *